United States Patent
Mai et al.

(10) Patent No.: US 12,538,750 B2
(45) Date of Patent: Jan. 27, 2026

(54) MASS TRANSFER DEVICE AND MASS TRANSFER SYSTEM

(71) Applicant: Century Technology (Shenzhen) Corporation Limited, Shenzhen (CN)

(72) Inventors: Chen-Fu Mai, New Taipei (TW); Ping Liu, Shenzhen (CN); Jie Xiao, Shenzhen (CN); Ze-Yuan Li, Shenzhen (CN); Meng-Chieh Tai, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 876 days.

(21) Appl. No.: 17/721,547

(22) Filed: Apr. 15, 2022

(65) Prior Publication Data

US 2023/0207373 A1    Jun. 29, 2023

(30) Foreign Application Priority Data

Dec. 23, 2021 (CN) .......................... 202111590271.3

(51) Int. Cl.
| | |
|---|---|
| B23P 19/00 | (2006.01) |
| H01L 21/683 | (2006.01) |
| H01L 25/075 | (2006.01) |
| H05K 13/04 | (2006.01) |
| H10H 20/857 | (2025.01) |
| H10H 20/01 | (2025.01) |

(52) U.S. Cl.
CPC ...... *H01L 21/6835* (2013.01); *H01L 25/0753* (2013.01); *H10H 20/857* (2025.01); *H01L 2221/68309* (2013.01); *H01L 2221/68363* (2013.01); *H10H 20/0364* (2025.01)

(58) Field of Classification Search
CPC .......... H01L 21/67144; H01L 21/6835; H01L 24/95; H01L 25/0753; H01L 2221/68309; H01L 2221/68313; H01L 2221/68354; H01L 2221/68363; H10H 20/01; H10H 20/0364; H10H 20/857
See application file for complete search history.

(56) References Cited

U.S. PATENT DOCUMENTS

| | | | |
|---|---|---|---|
| 11,088,182 B2 | 8/2021 | Chen et al. | |
| 11,302,562 B2 * | 4/2022 | Wang | ................... H01L 21/6835 |
| 11,569,409 B2 * | 1/2023 | Lee | ....................... H01L 25/0753 |
| 12,033,882 B2 * | 7/2024 | Wang | ................... H10H 20/857 |
| 2022/0190193 A1 * | 6/2022 | Hong | ................... H01L 21/6835 |
| 2023/0154903 A1 * | 5/2023 | Dai | ......................... H10H 20/01 |
| | | | 257/79 |

FOREIGN PATENT DOCUMENTS

| | | |
|---|---|---|
| CN | 213325755 U | 6/2021 |
| CN | 113394241 A | 9/2021 |
| CN | 113410157 A | 9/2021 |
| TW | 202103132 A | 1/2021 |

* cited by examiner

*Primary Examiner* — Paul D Kim
(74) *Attorney, Agent, or Firm* — ScienBiziP, P.C.

(57) ABSTRACT

A mass transfer device includes at least one transfer cavity. Each transfer cavity is configured to accommodate a plurality of micro light-emitting diodes. Each transfer cavity includes a bottom plate and a cavity wall connecting the bottom plate. The bottom plate defines a plurality of through holes spaced apart from each other. The transfer cavity is used to transfer the plurality of micro light-emitting diodes to the array substrate of a display panel through the plurality of through holes.

7 Claims, 8 Drawing Sheets

MASS TRANSFER DEVICE AND MASS TRANSFER SYSTEM

FIELD

The subject matter herein generally relates to display field, particularly relates to a mass transfer device, a mass transfer system, and a mass transfer method.

BACKGROUND

Recently, most displays are liquid crystal displays. With the development of display technology, the requirements for display resolution and contrast are becoming higher. Micro light emitting diode (micro LED) display technology, a new technology with higher brightness, better luminous efficiency, and lower efficiency, is being developed. Since micro LED are sized in tens of microns or even less, assembling such small components on a display substrate with high efficiency and low cost is problematic.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
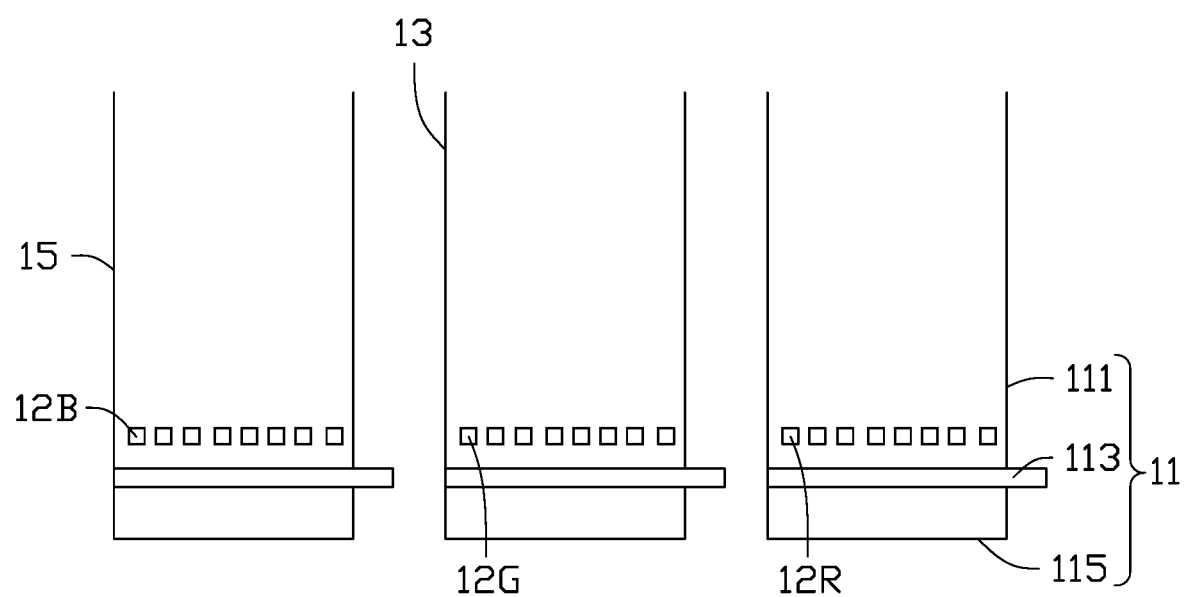
FIG. 1 is a view of a mass transfer device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

Figure 2:
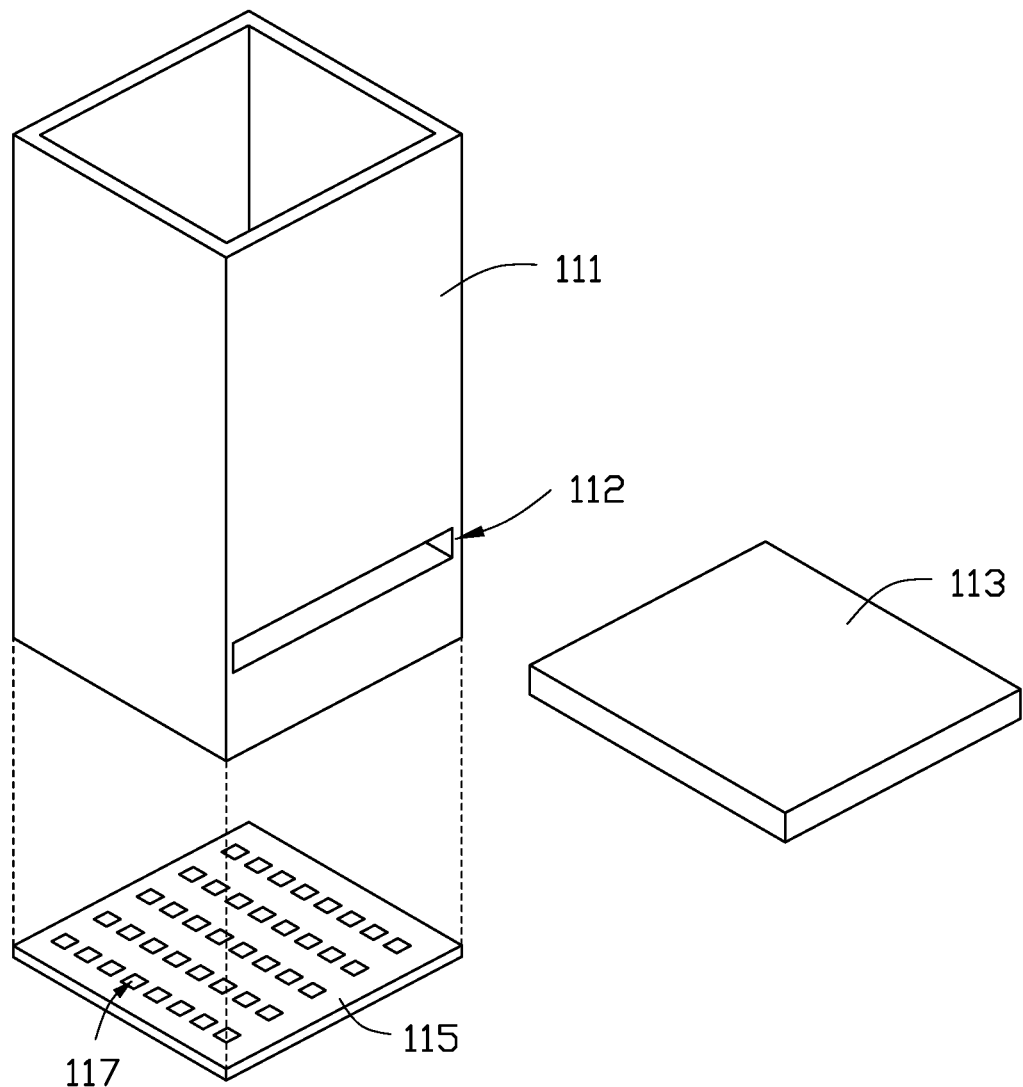
FIG. 2 is an exploded view of a transfer cavity according to an embodiment of the present disclosure.

FIG. 1 illustrates a mass transfer device 10. The mass transfer device 10 includes at least one transfer cavity 11. FIG. 1 shows three transfer cavities 11 as an example. Each transfer cavity 11 is used to receive a plurality of micro light emitting diodes (micro-LEDs) 12R. The transfer cavity 11 includes a bottom plate 115 and a cavity wall 111 connecting the bottom plate 115. As shown in FIG. 2, the bottom plate 115 defines a plurality of through holes 117 arranged in an array. The transfer cavity 11 is configured to transfer the plurality of micro-LEDs 12R to an array substrate of a display panel, by the through holes 117.

In one embodiment, the mass transfer device 10 also includes a baffle 113. An opening 112 is defined in the cavity wall 111, and the baffle 113 is detachably arranged in the transfer cavity 11 through the opening 112. The baffle 113 is used to carry the micro-LEDs 12R and to control the micro-LEDs 12R to fall onto the bottom plate 115, thereby the micro-LEDs 12R are controlled to pass through the through holes 117. Specifically, the baffle 113 can be moved inside and outside of the transfer cavity 11 through the opening 112. When the baffle 113 is inside of the transfer cavity 11, the micro-LEDs 12R are located on a side of the baffle 113 away from the bottom plate 115 and are supported by the baffle 113. The baffle 113 covers the bottom plate 115. That is, the baffle 113 covers and blocks each through hole 117, so as to prevent the plurality of micro LEDs 12R falling through the plurality of through holes 117. After the baffle 113 is moved from inside to outside of the transfer cavity 11, the through holes 117 are not covered by the baffle 113, so the micro-LEDs 12R drop from the inside to the outside of the transfer cavity 11 by any through hole 117.

In the present embodiment, the mass transfer device 10 includes three transfer cavities, transfer cavity 11, transfer cavity 13, and transfer cavity 15. The structures of the three transfer cavities are the same. Micro-LEDs in the same transfer cavity emit light of one certain color, and micro-LEDs in different transfer cavities emit light of different colors. Specifically, the transfer cavity 11 is used to receive a plurality of micro-LEDs 12R emitting first color light (such as red light), the transfer cavity 13 is used to receive a plurality of micro-LEDs 12G emitting second color light (such as green light), and the transfer cavity 15 is used to receive a plurality of micro-LEDs 12B emitting third color light (such as blue light). A size of each micro-LED 12R, a size of each micro-LED 12B and a size of each micro-LED 12B are the same. In other embodiments, a size of each micro-LED 12R, a size of each micro-LED 12B and a size of each micro-LED 12B are different. At this time, the sizes of the through holes for different transfer cavities are different, so that the micro-LEDs having different sizes can drop from inside to the outside of the transfer cavity through the through holes of corresponding transfer cavity.

In one embodiment, the baffle 113 may be arranged in the opening 112 simply to block the opening 12 without covering the bottom plate 115, to avoid the micro-LED 12R from falling out of the transfer cavity 11 by the opening 112.

In one embodiment, the through holes 117 in the bottom plate 115 have certain rules of arrangement. For the transfer cavity 11 to transfer a plurality of micro-LEDs 12R to the array substrate of the display panel, the through holes 117 are arranged to correspond to and be aligned with a plurality of capture holes in the array substrate one by one, so as to realize the mass transfer of a plurality of micro-LEDs 12R to the array substrate. That is, the transfer cavity 11 can set a distance between adjacent two through holes 117 on the bottom plate 115 according to a distance between adjacent two capture holes on the array substrate.

The mass transfer device 10 provided by the present disclosure accommodates a plurality of micro-LEDs 12R by setting at least one transfer cavity 11, and a plurality of through holes 117 are defined in the bottom plate 115, which can make the micro-LEDs 12R drop from the inside to the outside of the transfer cavity 11 by the through holes 117, so as to realize the mass transferring of micro-LEDs 12R. By setting at least three transfer cavities 13, each of which accommodating one color of micro-LEDs 12, the micro-LEDs 12R, the micro-LEDs 12G and the micro-LEDs 12B can be transferred in large quantities onto the array substrate.

Figure 3:
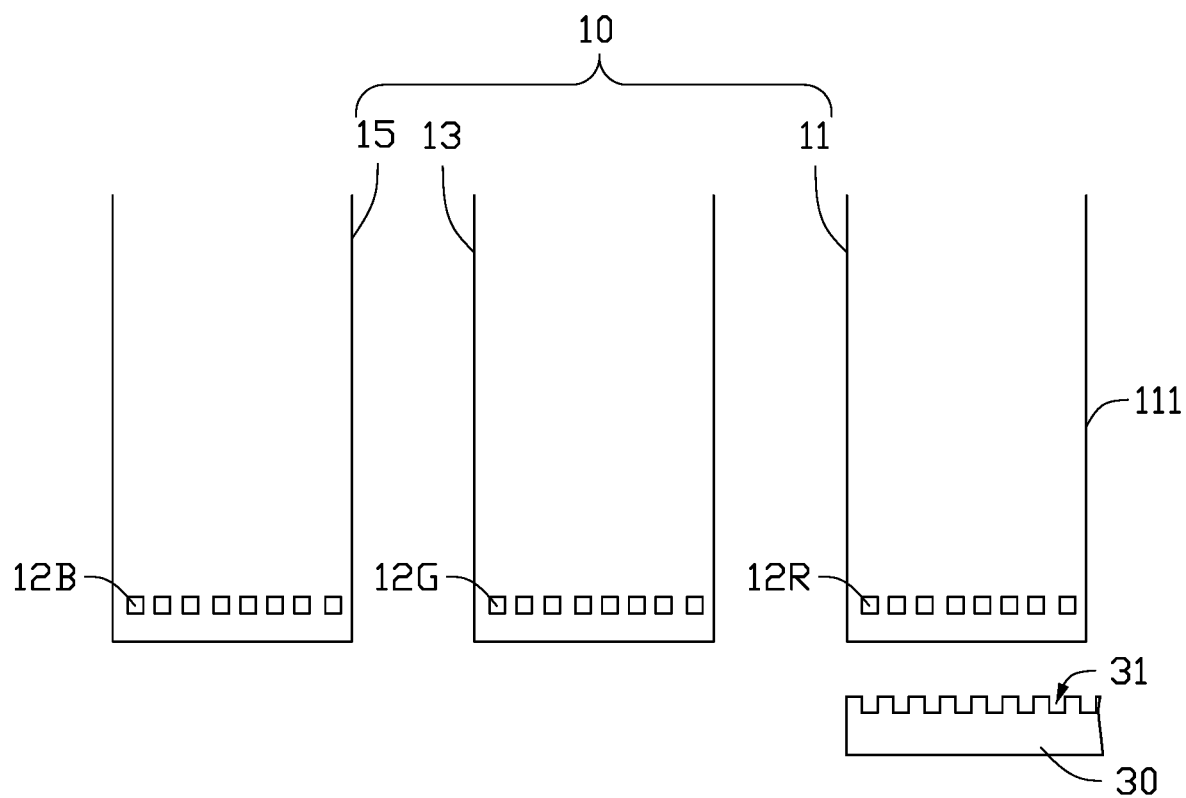
FIG. 3 is a view of a mass transfer system according to an embodiment of the present disclosure.

FIG. 3 illustrates a mass transfer system 100. The mass transfer system 100 includes the above mass transfer device 10 and an array substrate 30 for installing micro-LEDs. The array substrate 30 defines a plurality of capture holes 31 arranged in an array, and the array substrate 30 is movably arranged on a side of the bottom plate 115 away from the cavity wall 111.

In one embodiment, each through hole 117 in the transfer cavity 11 can be aligned with one capture hole 31, so that the micro-LEDs 12R in the transfer cavity 11 can fall into the capture holes 31 one-to-one through the through holes 117 at the same time. Specifically, each through hole 117 is aligned with one capture hole 31, and one micro-LED 12R can fall into one capture hole 31 by one through hole 117. Each capture hole 31 is used to receive one micro-LED 12R.

In one embodiment, unfilled capture holes 31 in the array substrate 30 can each be aligned with one through hole 117 by moving the array substrate 30, so that the micro-LEDs 12R continues to fall into the unfilled capture hole 31 through the through holes 117. Specifically, in the present embodiment, a number of the micro LEDs 12R contained in the transfer cavity 11 is greater than a number of the capture holes 31 in the array substrate, and a number of capture holes 31 in the array substrate is greater than a number of the through holes 117 of the transfer cavity 11. When each through hole 117 is aligned with one capture hole 31, the capture hole 31 aligned with the through hole 117 is filled by the micro-LED 12R dropping thereinto. At this time, the array substrate 30 also includes some capture holes 31 not filled by the micro-LED 12R. By moving the array substrate 30, the unfilled capture hole 31 can be aligned with the through hole 117, so that the micro-LED 12R falls into the unfilled capture hole 31 by the through hole 117. In other embodiments, a number of capture holes 31 of the array substrate can also be equal to a number of the through holes 117 of the transfer cavity 11, so that when each through hole 117 is aligned with the capture hole 31, each capture holes 31 can be filled by one micro-LED 12R.

In one embodiment, the array substrate 30 may be attached to the bottom plate 115 and be moved so that the micro-LEDs 12R fall out of the transfer cavity 11 only when each through hole 117 is aligned with one unfilled capture hole 31. Specifically, when the array substrate 30 is attached to the bottom plate 115 and is moved, the array substrate 30 can also be used to control the micro-LED 12R to fall out of the transfer cavity 11. Until a through hole 117 is aligned with one capture hole 31, the micro-LED 12R is not able to fall out through the through hole 117 because the array substrate 30 is attached to the bottom plate 115. When the through hole 117 is aligned with one capture hole 31, one and only one micro-LED 12R falls into the unfilled capture hole 31 through the through hole 117. If the capture hole 31 has already received one micro-LED 12R, the received micro-LED 12R in the capture hole 31 prevents another micro-LED 12R from falling into the capture hole 31, so that only one micro-LED 12R is filled in each capture hole 31.

Figure 4:
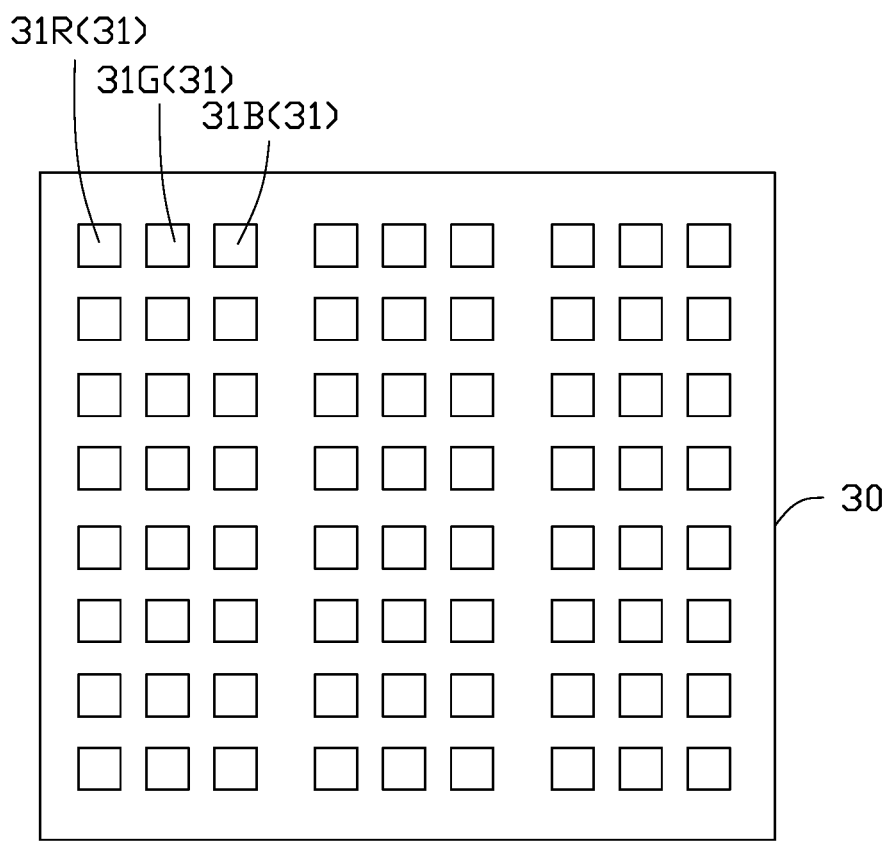
FIG. 4 is a planar view of an array substrate in a display according to an embodiment of the present disclosure.

In one embodiment, as shown in FIG. 3 and FIG. 4, the capture holes 31 in the array substrate 30 may include a plurality of capture holes 31R, a plurality of capture holes 31G and a plurality of capture holes 31B. Each capture hole 31R is used to receive one micro-LED 12R from the transfer cavity 11, each capture hole 31G is used to receive one micro-LED 12G from the transfer cavity 13, and each capture hole 31B is used to receive one micro-LED 12B from the transfer cavity 15. Specifically, the transfer cavity 11, the transfer cavity 13, and the transfer cavity 15 may be arranged in a row or in a column. The array substrate 30 can move from the transfer cavity 11, to the transfer cavity 13, and to the transfer cavity 15 in turn, so that each capture hole 31 is filled with one micro-LED from each of the three transfer cavities.

Figure 5:
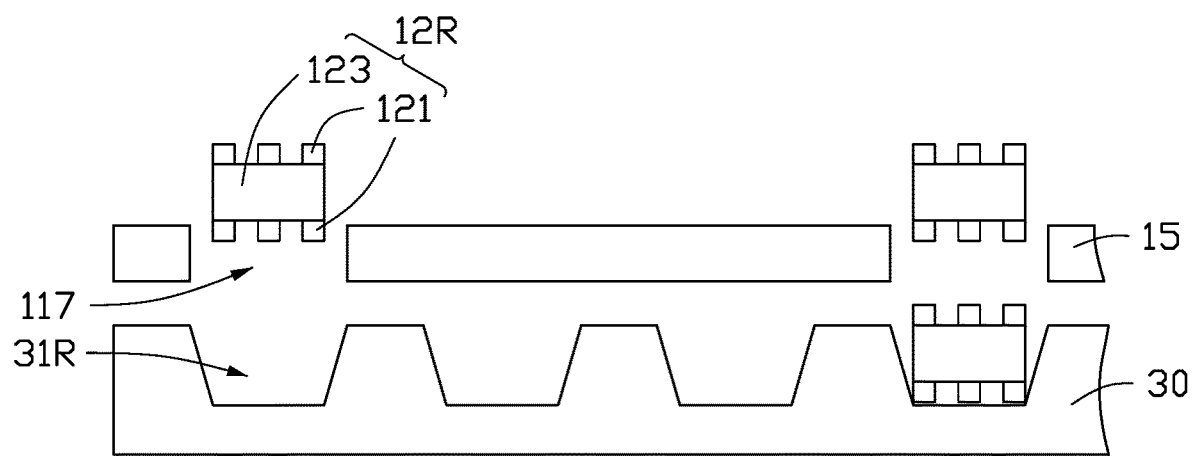
FIG. 5 is a cross-sectional view of the mass transfer system according to an embodiment of the present disclosure.

In one embodiment, as shown in FIG. 5, the micro-LED 12R falls into the capture hole 31R through the through hole 117 by gravity. The micro-LED 12R includes a light-emitting part 123 and two electrodes 121 arranged on opposite sides of the light-emitting part 123, so that when each micro-LED 12R falls by gravity, one of the electrodes 121 makes contact with the bottom of the capture hole 31R.

Figure 6:
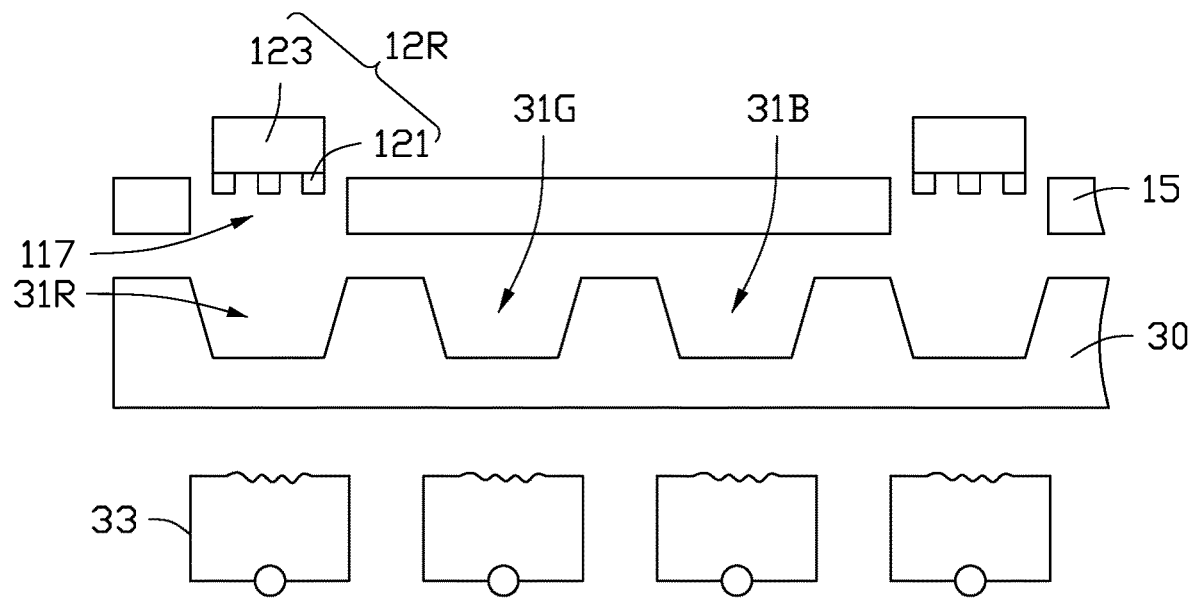
FIG. 6 is a cross-sectional view of a mass transfer system according to another embodiment of the present disclosure.

In one embodiment, as shown in FIG. 6, each micro-LED 12R has a first magnetic pole, and the mass transfer system 100 also includes a magnetic generator 33. The magnetic generator 33 is arranged on a side of the array substrate 30 away from the bottom plate 115 to generate a magnetic field to attract the first magnetic pole of each micro-LED 12R, so that the first magnetic pole of each micro-LED 12R receives an adsorption force due to the magnetic field, so that when each micro-LED 12R is transferred from the through hole 117 to the capture hole 31R, the side of each micro-LED 12R with the first magnetic pole is always down, that is to say, facing the array substrate 30. Specifically, three magnetic generators 33 can be set to correspond to the capture holes 31R, the capture holes 31G and the capture holes 31B respectively, and a corresponding one magnetic generator 33 is powered on when the array substrate 30 is transferred to different transfer cavities, so as to prevent the micro-LED from sticking to the side of the bottom plate 115 away from the array substrate 30 and affecting undropped micro-LEDs from falling out from the through hole 117.

In one embodiment, the micro-LED 12R includes a light emitting part 123 and an electrode 121, and the electrode 121 is the first magnetic pole. Under the action of the magnetic generator 33, the electrode 121 of the micro-LED 12R approaching the array substrate 30 is pointed towards the magnetic generator 33, so as to fall into the capture hole 31R through the through hole 117.

Figure 7:
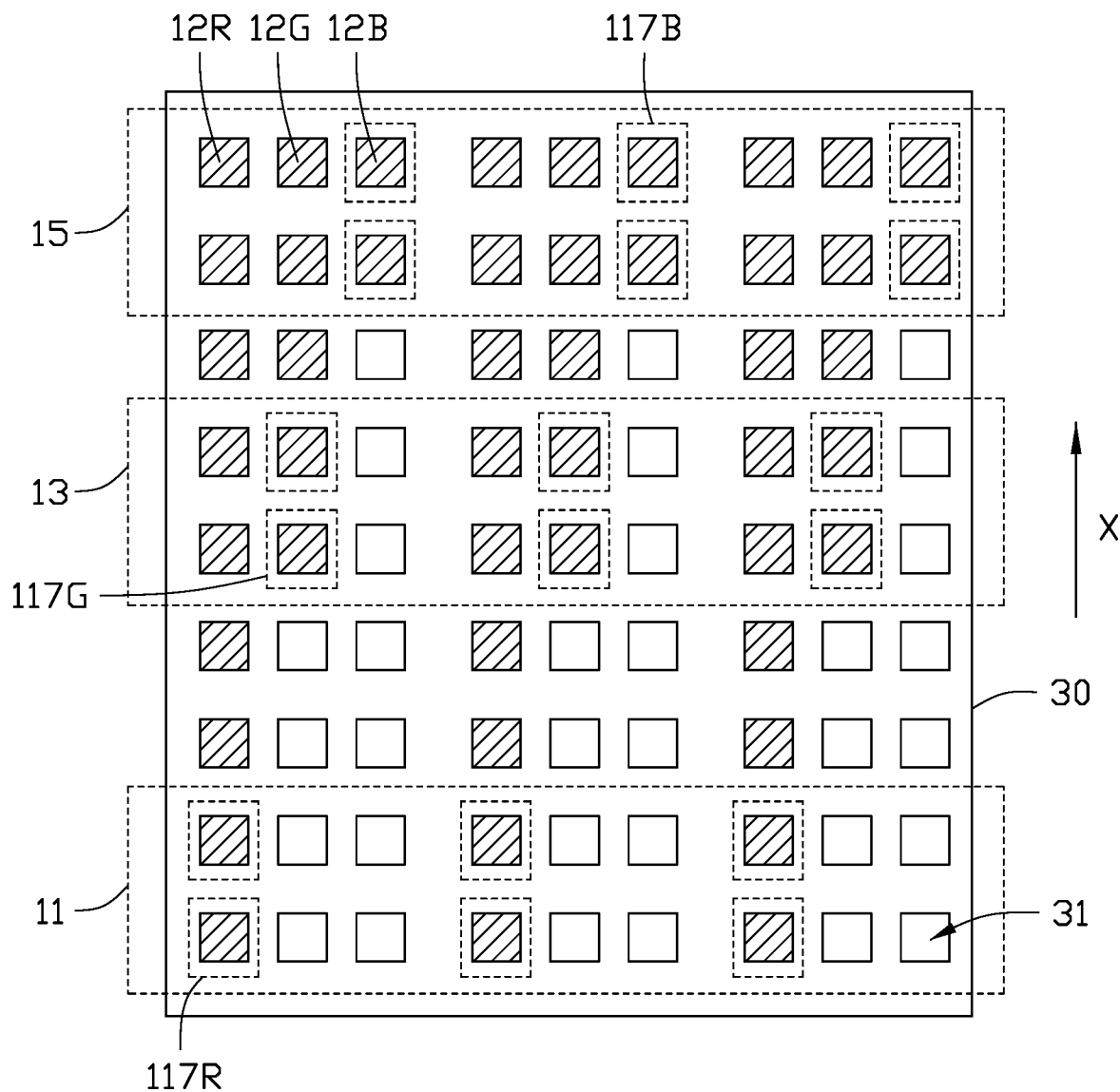
FIG. 7 is a view showing a state of the array substrate in the display in the mass transfer process.

In one embodiment, as shown in FIG. 7, the micro-LEDs in the transfer cavity 11, the transfer cavity 13, and the transfer cavity 15 fill a plurality of capture holes 31 in the array substrate 30. That is, the array substrate 30 moves along a first direction X, so that the through holes 117R of the transfer cavity 11, the through holes 117G of the transfer cavity 13, and the through holes 117B of the transfer cavity 15 are in turn aligned with the capture holes 31 of the array substrate 30, so that a plurality of micro-LEDs 12R, 12G and 12B are arranged on the array substrate 30. The micro-LED 12R emits red light, the micro-LED 12G emits green light, and the micro-LED 12B emits blue light. The mass transfer system 100 prepares a display panel by transferring red, green, and blue micro-LEDs onto the array substrate 30. In other embodiments, after the micro-LEDs 12R are transferred to all capture holes 31R of the array substrate 30, the micro-LEDs 12G and the micro-LEDs 12B can be transferred respectively to capture holes 31G and capture holes 31B of the array substrate 30 in turn.

In this embodiment, each micro-LED is used as a light-emitting element of the display panel and corresponds to a sub-pixel of the display panel. That is, the display panel defines a plurality of sub-pixels arranged in an array, a corresponding one micro-LED is in each sub-pixel.

The mass transfer system 100 in the present disclosure can transfer a plurality of micro-LEDs into a plurality of capture holes 31 in the array substrate 30 in batches by setting the mass transfer device 10 and the movable array substrate 30. By setting the moving direction of the array substrate 30 and/or the arrangement direction of the transfer cavities 11, 13, and 15, all capture holes 31 can be filled with micro-LEDs of appropriate colors, so as to realize the image display function.

Figure 8:
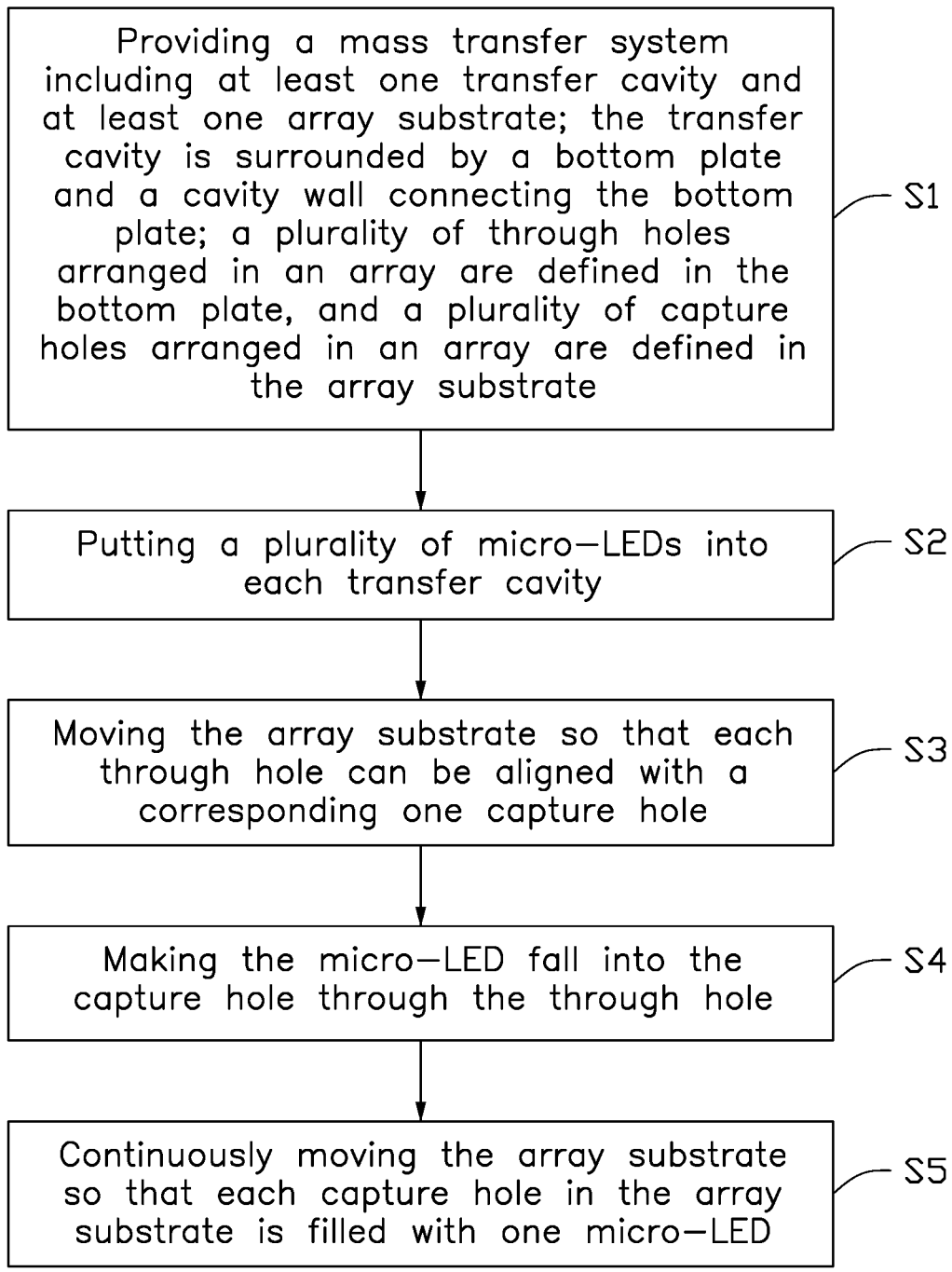
FIG. 8 is a flowchart of a mass transfer method according to an embodiment of the present disclosure.

The present disclosure also provides a mass transfer method. As shown in FIG. 8, the mass transfer method includes the following step S1 to step S5.

Step S1: providing a mass transfer system including at least one transfer cavity and at least one array substrate. The transfer cavity includes a bottom plate and a cavity wall connecting the bottom plate. A plurality of through holes in an array is defined in the bottom plate, and a plurality of capture holes in an array are defined in the array substrate.

Step S2: placing a plurality of micro-LEDs into each transfer cavity.

Step S3: moving the array substrate so that each through hole can be aligned with a corresponding one capture hole.

Step S4: making the micro-LED to fall into the capture hole through the through hole.

Step S5: continuously moving the array substrate so that each capture hole in the array substrate is filled with one micro-LED.

In one embodiment, the mass transfer system in step S1 is the mass transfer system 100 in the embodiment of the present disclosure, which includes a transfer cavity 11, a transfer cavity 13 and a transfer cavity 15 having the same structure. Taking the transfer cavity 11 as an example, it also includes a baffle 113, which can be moved inside and outside of the transfer cavity 11 by the opening 112 in the cavity wall 111.

In one embodiment, before the step S2, it also includes moving the baffle 113 so that the bottom plate 115 is completely covered by the baffle 113. That is, each through hole 117 is covered by the baffle 113. After step S2, it also includes removing the baffle 113 so that each through hole 117 can pass through the micro-LED 12R. That is, the baffle 113 is used to control whether the micro-LED 12R can pass through the through hole 117. When filling the micro-LEDs 12R into the transfer cavity 11, the baffle 113 prevents the micro-LEDs 12R from passing through the through hole 117. After placing the micro-LEDs 12R into the transfer cavity, the baffle 113 is remove from the transfer cavity, so that the micro-LEDs 12R can fall out of the transfer cavity 11 in batches through the through holes 117. The baffle 113 may also be used to cover the opening 112 to prevent the micro-LEDs 12R from falling out of the transfer cavity 11 from the opening 112.

In one embodiment, step S2 specifically includes putting micro-LEDs emitting light of a same color into the same transfer cavity, and different transfer cavities are placed micro-LEDs emitting light of different colors. That is, the micro-LEDs 12R emitting red light are placed in the transfer cavity 11, the micro-LEDs 12G emitting green light are placed in the transfer cavity 13, and the micro-LEDs 12B for emitting blue light are placed in the transfer cavity 15.

In one embodiment, step S4 specifically includes making each micro-LED to fall into the capture hole 31 by gravity. At this time, the micro LED includes a light-emitting part 123 and electrodes 121 arranged on opposite sides of the light-emitting part 123, so that when the micro-LED falls into the capture hole 31 under the action of gravity, one electrode 121 always contacts the bottom of the capture hole 31.

In one embodiment, step S4 specifically includes providing a magnetic generator 33 on a side of the array substrate 30 away from the bottom plate 115 to generate a magnetic field. At this time, each micro-LED has a first magnetic pole, and the micro-LEDs with the first magnetic poles fall into the capture hole 31 through the through holes 117 under the action of the magnetic field. Specifically, under the action of the magnetic field, the first magnetic pole receives an adsorption force, so that when each micro-LED is transferred from the through hole 117 into the capture hole 31, the side of each micro-LED with the first magnetic pole always faces the array substrate 30.

In one embodiment, step S5 specifically includes: attaching the array substrate 30 to three transfer cavities in turn or at the same time, so that a plurality of capture holes 31 on the array substrate 30 are respectively filled with micro light-emitting diodes used to emit light of different colors in the three transfer cavities.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A mass transfer device comprising:
    at least one transfer cavity, each of at least one transfer cavity being configured to accommodate a plurality of micro light-emitting diodes, each of at least one transfer cavity comprising a bottom plate and a cavity wall connecting the bottom plate,
    the bottom plate defining a plurality of through holes spaced apart from each other, wherein the at least one transfer cavity transfers the plurality of micro light-emitting diodes to an array substrate of a display panel through the plurality of through holes,
    wherein the mass transfer device further comprises a baffle, an opening is defined in the cavity wall, the baffle is configured to move in and out one of at least one transfer cavity by the opening, the baffle is configured to carry the plurality of micro light-emitting diodes on a side of the baffle away from the bottom plate and control plurality of micro light-emitting diodes to fall onto the bottom plate.

2. The mass transfer device of claim 1, wherein the mass transfer device comprises three transfer cavities, each of the three transfer cavities is configured for accommodating a plurality of micro light-emitting diodes emitting light of a same color, and different transfer cavities of the three transfer cavities accommodate a plurality of micro light-emitting diodes emitting light of different colors.

3. The mass transfer device of claim 1, wherein the plurality of through holes are arranged in an array.

4. A mass transfer system comprising:

a mass transfer device defining at least one transfer cavity, each of at least one transfer cavity being configured to accommodate a plurality of micro light-emitting diodes, each of at least one transfer cavity comprising a bottom plate and a cavity wall connecting the bottom plate, the bottom plate defining a plurality of through holes spaced apart from each other, and an array substrate, the array substrate defining a plurality of capture holes, and the array substrate being movably arranged on a side of the bottom plate away from the cavity wall, each of the plurality of capture holes being configured to receive one of the plurality of micro light-emitting diodes when each of the plurality of through holes is aligned with a corresponding one of the plurality of capture holes, wherein each of the plurality of micro light emitting diodes comprises a first magnetic pole, and the mass transfer system further comprises a magnetic generator on a side of the array substrate away from the bottom plate, the magnetic generator is configured for generating a magnetic field to attract each of the plurality of micro light emitting diodes into a corresponding one of the capture holes through the corresponding one of the plurality of through holes.

5. The mass transfer system of claim 4, further comprising a baffle, wherein an opening is defined in the cavity wall, the baffle is detachably arranged in the transfer cavity through the opening, the baffle is configured for covering the plurality of through holes.

6. The mass transfer system of claim 4, wherein the at least one transfer cavity comprises three transfer cavities, each of the three transfer cavities is configured for accommodating a plurality of micro light-emitting diodes emitting light of a same color, and different transfer cavities of the three transfer cavities accommodate a plurality of micro light-emitting diodes emitting light of different colors.

7. The mass transfer system of claim 4, wherein each of the plurality of micro light-emitting diodes comprises a light emitting part and an electrode on a side of the light emitting part, and the electrode is the first magnetic pole.

* * * * *